(12) United States Patent
Kubo et al.

(10) Patent No.: US 6,537,899 B2
(45) Date of Patent: *Mar. 25, 2003

(54) SEMICONDUCTOR DEVICE AND A METHOD OF FABRICATING THE SAME

(75) Inventors: Hirotoshi Kubo, Gunma (JP); Eiichiroh Kuwako, Gunma (JP)

(73) Assignee: Sanyo Electric Co., Ltd., Moriguchi (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/153,346

(22) Filed: Sep. 15, 1998

(65) Prior Publication Data

US 2002/0008282 A1 Jan. 24, 2002

(30) Foreign Application Priority Data

Sep. 16, 1997 (JP) ............................................. 9-250998

(51) Int. Cl.[7] ............................................. H01L 21/22
(52) U.S. Cl. ........................................ 438/546; 438/547
(58) Field of Search ................................. 257/340, 341; 438/546, 547

(56) References Cited

U.S. PATENT DOCUMENTS

| | | | | |
|---|---|---|---|---|
| 5,473,176 A | * | 12/1995 | Kakumoto | .................. 257/192 |
| 5,795,793 A | * | 8/1998 | Kinzer | ........................ 437/41 |
| 5,886,383 A | * | 3/1999 | Kinzer | ........................ 257/341 |
| 5,966,603 A | * | 10/1999 | Eitan | ........................ 438/258 |

* cited by examiner

Primary Examiner—Steven Loke
Assistant Examiner—Ori Nadav
(74) Attorney, Agent, or Firm—Armstrong, Westerman & Hattori, LLP (57) ABSTRACT

The invention relates to a power MOSFET and reduction of the number of mask steps in a process of fabricating the power MOSFET. The increase of a parasitic capacitance due to the reduction is suppressed. In place of a thick insulating film 3, a gate insulating film 12 is formed on the entire surface of a semiconductor substrate. The gate-drain parasitic capacitance which uses the gate insulating film as a dielectric is suppressed by forming a removal region EL.

9 Claims, 10 Drawing Sheets

SEMICONDUCTOR DEVICE AND A METHOD OF FABRICATING THE SAME

BACKGROUND OF THE INVENTION

1. Field of the Invention

The present invention relates to a semiconductor device and a method of fabricating it, and more particularly to reduction of the number of mask steps in a process of fabricating a power MOSFET, and a structure for suppressing a parasitic capacitance in the power MOSFET which is fabricated in this process.

2. Description of the Related Art

Figure 5:
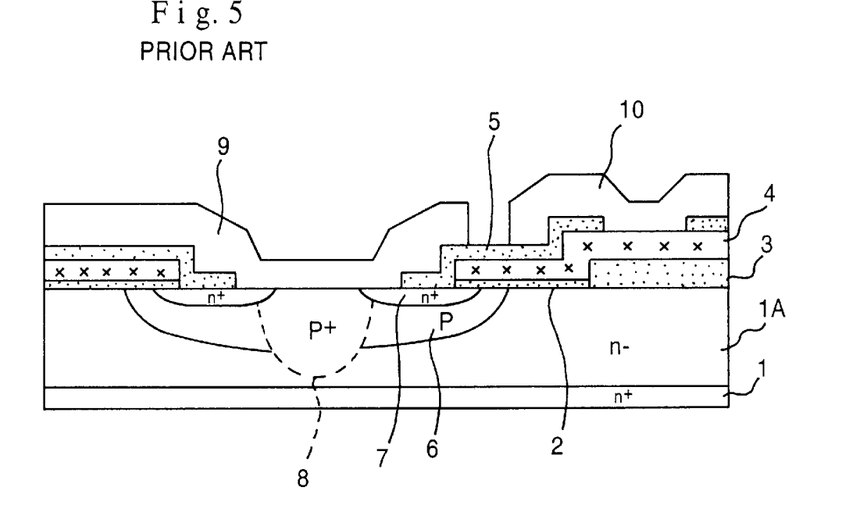
FIG. 5 is a section view illustrating the structure of a planar type power MOSFET of the prior art.
Figure 6:
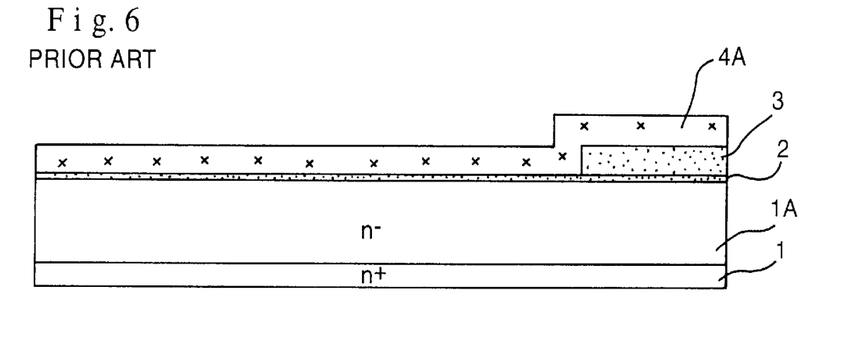
FIG. 6 is a section view illustrating a method of fabricating the power MOSFET of the prior art.
Figure 7:
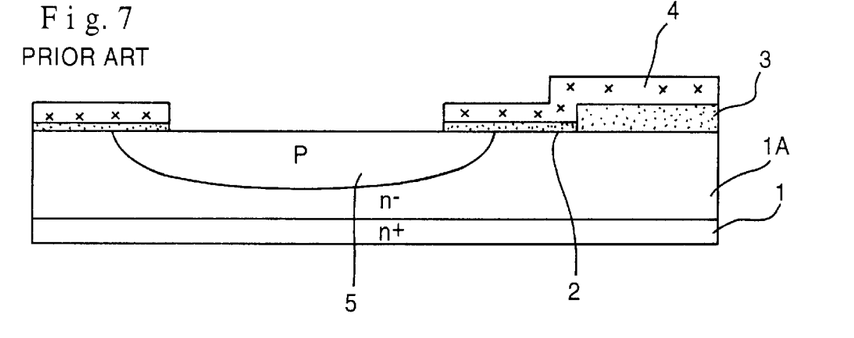
FIG. 7 is a section view illustrating the method of fabricating the power MOSFET of the prior art.
Figure 8:
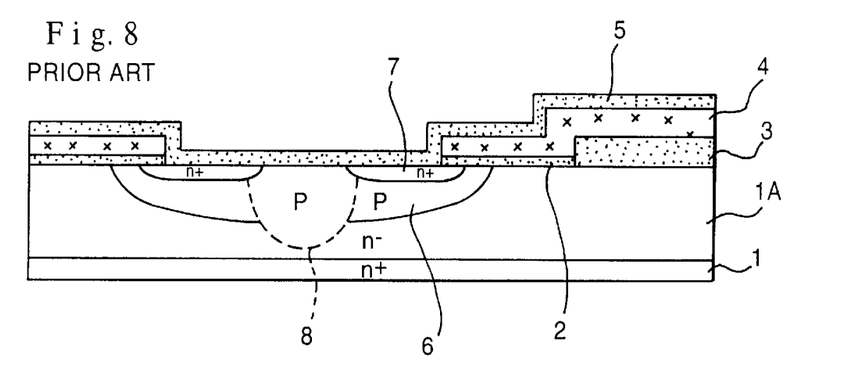
FIG. 8 is a section view illustrating the method of fabricating the power MOSFET of the prior art.

Hereinafter, a power MOSFET of the prior art and a method of fabricating it will be described with reference to the drawings. FIG. 5 is a section view showing the structure of a power MOSFET of the prior art, and FIGS. 6 to 8 are section views illustrating a method of fabricating the power MOSFET of the prior art.

In the power MOSFET of the prior art, as shown in FIG. 5, a drain layer 1A consisting of an $n^-$ epitaxial layer is formed on an $n^+$ semiconductor substrate 1, and a channel region 6 is formed in a part of the surface layer of the drain layer by diffusion of a $p^-$ type impurity. A body region layer 8 is formed at the center of the channel region by diffusing a $p^+$ impurity. A source region 7 which is formed by diffusion of an $n^+$ impurity is disposed in the surface layer of the channel region 6 so as to surround the body region layer.

An insulating film 3 is disposed in a region for forming a pad electrode 10 which will be described later.

A gate insulating film 2 and a gate electrode 4 are sequentially formed on the channel region 6 so as to overlap with a part of the channel region 6 and the source region 7.

A PSG (Phospho-Silicate Glass) film 5 is formed so as to cover the gate electrode 4. In the PSG film 5, an opening is formed in a part of the region where the insulating film 3 is formed. The pad electrode 10 for contact to the gate electrode 4 which is exposed through the opening is formed in the opening and in the vicinity thereof. (as shown in FIG. 5)

A source electrode wiring (interconnecting layer) 9 for contact to the source region 7 is formed on the source region 7 and the body region 8.

The steps of fabricating the power MOSFET will be described with reference to FIGS. 6 to 8.

First, the $n^-$ drain layer 1A is formed on the $n^+$ semiconductor substrate 1 by epitaxial growth. Next, a thick oxide film is formed on the drain layer, and a resist film is selectively formed by a photolithography process. A patterning process is conducted with using the resist film as a first mask to form the thick insulating film 3 for the pad electrode. Thereafter, an oxide film formed as the gate insulating film 2 is grown. Then, a polycrystalline silicon film 4A is formed on the entire surface. (See FIG. 6.)

Hereinafter, a region where the thick oxide film is formed is referred to as a peripheral region.

Next, a photoresist film is formed on the polycrystalline silicon film 4A, and then patterned by the photolithography method. The polycrystalline silicon film and the oxide film are etched with using the patterned resist film as a second mask, so that the gate insulating film 2 and the gate electrode 4 are formed as shown in FIG. 7.

Hereinafter, a region where the gate electrode is formed in a lattice-like shape is referred to as a cell region.

Next, a $p^-$ type impurity is injected with using the gate insulating film 2 and the gate electrode 4 as a mask, to form the channel region 6 in a part of the surface layer of the drain layer 1A. (See FIG. 7.)

Then, a photoresist (not shown) is again applied to the entire surface, and the third photoresist film is patterned so that the photoresist film in the center portion of the channel region 6 selectively remains. An $n^-$ type impurity is injected into the channel region 6 with using the photoresist film as a mask, to form the source region 7. Thereafter, the resist film is removed away. A photoresist is again applied, and then patterned so that an opening is formed in the center portion. Then, a $p^-$ type impurity is injected into the channel region 6 with using the new resist film (not shown) as a fourth mask, thereby forming the body region 8. Next, the new resist film is removed away and the PSG film 5 is formed on the entire surface (FIG. 8).

Thereafter, a resist film (not shown) is formed on the PSG film 5, and then patterned by the photolithography method so that openings are formed in a peripheral region where the pad electrode will be formed, the body region 8, and a part of the source region 7. The PSG film 5 is etched and removed away with using the patterned resist film as a fifth mask. Next, a film of a metal such as aluminum is formed on the entire surface by vapor deposition or the like, and then patterned with using a sixth mask. The source electrode 9 is formed so as to be contacted with the body region 8 and a part of the source region 7 which are exposed as a result of patterning, and the pad electrode 10 is formed on the insulating film 3. As a result, the power MOSFET having the structure shown in FIG. 5 is formed.

For the above-described planar type power MOSFET, a photomask for a photolithography process for patterning is required in each of the following steps:

1) the step of forming the mask for forming the initial thick oxide film for the bonding pad,
2) the step of forming the patterning mask for forming the gate electrode (FIG. 7),
3) the step of forming the resist mask for forming the source region 7 (FIG. 8),
4) the step of forming the resist mask for forming the body region 8 (FIG. 8),
5) the step of forming the resist mask in the case where the contact hole of the source region 7 is formed in the PSG film 5, and
6) the step of forming the resist mask for patterning the pad electrode 10 and the source electrode wiring 9.

As a result, six photomasks are required in total.

The device isolation step is not included in the above-mentioned steps. A mask is necessary also in the device isolation, and hence a further mask is required.

Therefore, problems in that the number of mask steps and accompanying steps is very large, that the production process is complicated, and that the production cost is high are fabricated.

In the production process of a trench type power MOSFET, a body region and a source region are formed with using a photoresist as a mask. Therefore, the miniaturization is limited and it is difficult to increase the cell density.

SUMMARY OF THE INVENTION

The invention has been conducted in view of the defects of the prior art.

The object of the invention is to provide a power MOSFET Device with a high cell density.

Another object of the invention is to reducing the number of steps in a process fabricating a power MOSFET.

First, the gate insulating film formed below the gate electrode is elongated from the cell region to the peripheral region, whereby a power MOSFET can be obtained without selectively forming a thick insulating film for isolation of a pad electrode with the substrate. The increase of a parasitic capacitance due to the elongation is solved by selectively removing at least a part of one gate electrode located in the peripheral region, and the gate insulating film below the one gate electrode.

When, in order to eliminate the patterning step of the thick oxide film which has been described with reference to FIG. 6, the gate insulating film is formed on the entire surface, a parasitic capacitance which uses the gate insulating film as a dielectric is fabricated. However, the increase of the parasitic capacitance can be suppressed by forming the removed region of the gate insulating film in the peripheral region.

Second, the defects can be eliminated by a configuration comprising: an insulating film formed on the gate electrode; a side wall formed on side walls of the lattice-like gate electrode, the gate insulating film below the gate electrode, and the insulating film on the gate electrode; a recess formed in the semiconductor layers surrounded by the side wall; a channel layer of an opposite conduction type which is formed from a region where the recess is formed, to a vicinity of a region where the gate electrode is formed; and a source region of one conduction type which is formed from a vicinity of the recess, to the region where the gate electrode is formed.

As the miniaturization of a cell region is more advancing year after year, a gate made of polycrystalline silicon and a gate electrode made of a metal become thinner. Even in such a case, reduction of the step coverage and increase of the resistance due to the reduction can be suppressed because a thick oxide film is not formed.

Third, an insulating material is embedded in a region where the gate electrode and the gate insulating film below the gate electrode are removed away, whereby improvement of properties such as dielectric strength can be realized.

Fourth, because of the process in which the gate insulating film, the conductor layer, and the insulating film are sequentially formed over the periphery of the semiconductor chip, the number of masks required can be reduced by one. The channel region and a first impurity region layer are formed with using the gate electrode as a mask, the first recess is formed with using the side wall as a mask, and at the same time the source region is formed by removing the center of the first impurity region layer, with the result that the semiconductor device can be realized by using three masks in total.

Fifth, when, in the step of forming the gate electrode, an opening is formed in a part of the peripheral region by removing the gate electrode, the parasitic capacitance in the peripheral region can be prevented from being increased, without increasing the number of steps.

Sixth, when, in the step of forming the first impurity region layer, a second impurity region layer of the same conduction type is formed in the opening, and, in the step of forming the first recess, a second recess is formed by removing a part of the second impurity region layer, the second recess can be used as a channel stopper.

Seventh, the dielectric strength can be improved by burying the second recess with an insulating film.

PREFERRED EMBODIMENTS OF THE INVENTION

Hereinafter, a planar type power MOSFET according to an embodiment of the invention will be described with reference to the accompanying drawings.

Embodiment 1

Figure 1:
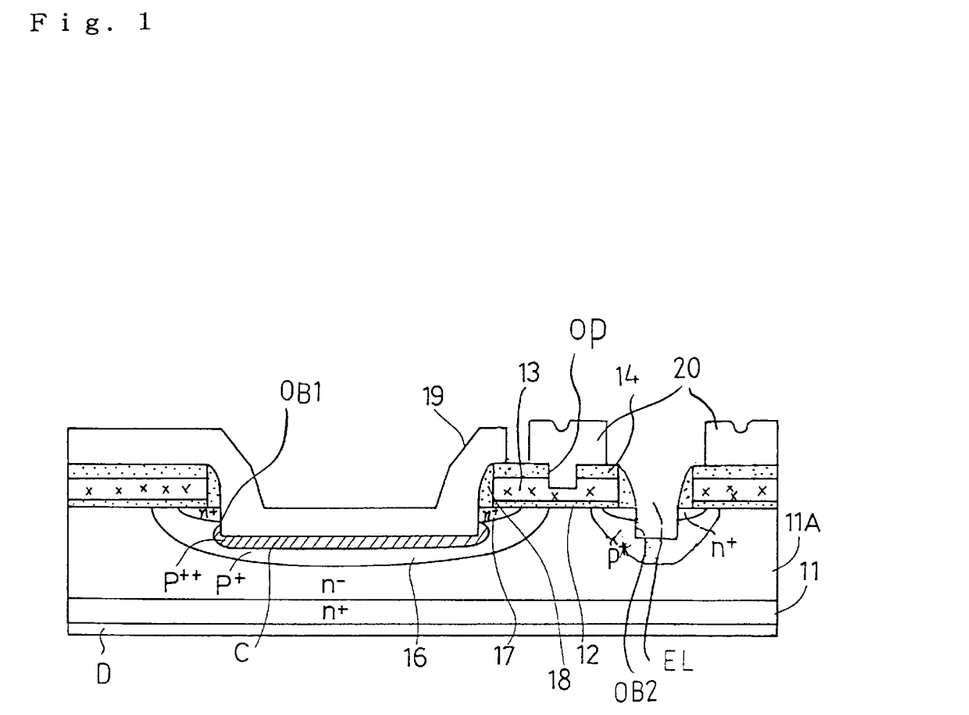
FIG. 1 is a section view illustrating the structure of a planar type power MOSFET according to a first embodiment of the invention.
Figure 2:
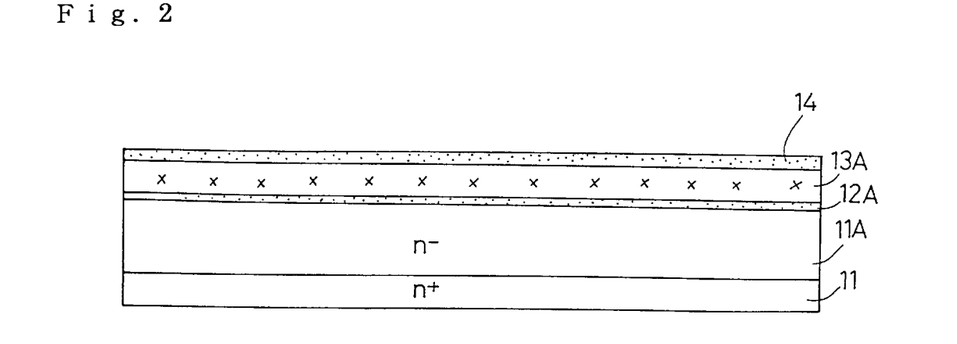
FIG. 2 is a section view illustrating a method of fabricating the power MOSFET according to the first embodiment of the invention.
Figure 3:
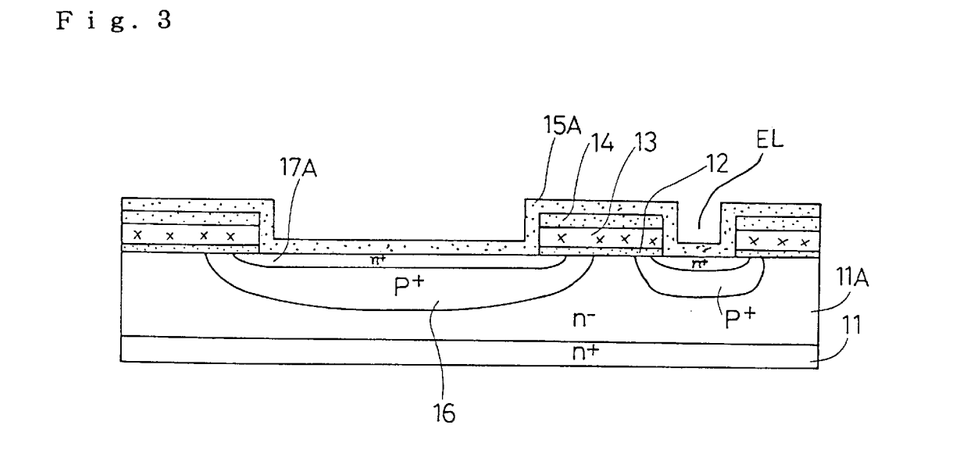
FIG. 3 is a section view illustrating the method of fabricating the power MOSFET according to the first embodiment of the invention.
Figure 4:
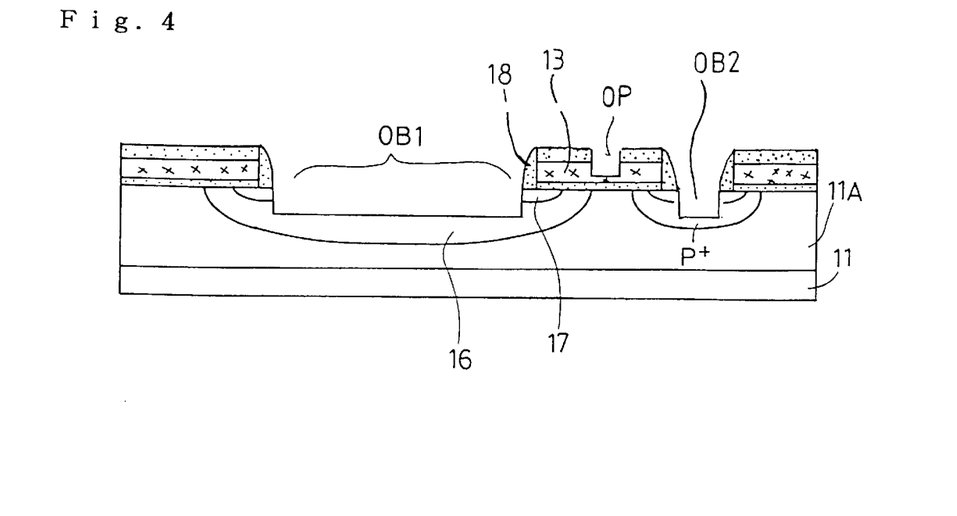
FIG. 4 is a section view illustrating the method of fabricating the power MOSFET according to the embodiment of the invention.

FIG. 1 is a section view illustrating the structure of a planar type power MOSFET according to the first embodiment of the invention, and FIGS. 2 to 4 are section views illustrating a method of fabricating the planar type power MOSFET according to the embodiment.

In the specification, a method of fabricating an N type power MOSFET will be described as an example. When the conduction types are inverted, a P type power MOSFET can be fabricated by the same method.

In the power MOSFET, as shown in FIG. 1, a drain layer 11A consisting of an n⁻ epitaxial layer is formed on an n⁺ semiconductor substrate 11, and a channel region 16 is formed in a part of the surface layer of the drain layer by diffusion of a p⁻ type impurity. A recess is formed at the center of the channel region. A source region 17 which is formed by diffusion of an n⁺ impurity is disposed in the surface layer of the channel region 16 so as to surround the surface layer of the recess.

A gate insulating film 12, a gate electrode 13, and an NSG (Non doped Silicate Glass) film 14 are sequentially formed on the drain layer 11A. A side wall insulator 18 which consists of an NSG film is formed on the side walls of the gate insulating film 12, the gate electrode 13, and the NSG film 14. The side wall insulator 18 is formed so that its end portion coincides with the end portion of the source region 17.

An opening OP to be a gate contact hole is formed in a part of the NSG film 14 which covers the gate electrode 13. In the NSG film which is opposite to the side wall insulator 18 across the opening OP, a removal region EL (forms a second recess) where the NSG film and a surface layer of the drain layer 11A are removed, is disposed.

A source electrode wiring 19 which is made of AlSi is formed so as to cover the recess OB1 formed at the center of the channel region 16. A gate electrode wiring 20 is made of AlSi and contacts to the gate electrode 13 via the opening OP of the NSG film 14 is formed on the NSG film 14.

In the removal region EL also, a recess OB2 is formed at the same time with the recess OB1, so as to function as a channel stopper which will be described later.

A drain electrode D is formed on the back face of the semiconductor substrate 11.

The steps of fabricating the power MOSFET will be described with reference to FIGS. 2 to 4.

First, the n⁻ drain layer 11A is formed on the n⁺ semiconductor substrate 11 by epitaxial growth. As shown in FIG. 2, thereafter, an oxide film 12A which will be formed as the gate insulating film 12 is grown. Then, a polycrystalline silicon film 13A is formed on the entire surface, and the NSG film 14 is deposited on the polycrystalline silicon film 13A.

Next, a photoresist film (not shown) is formed on the NSG film 14, and then patterned by the photolithography method. The NSG film 14, the polycrystalline silicon film 13A, and the oxide film 12A are etched with using the patterned resist film as a first mask to form the gate insulating film 12 and the gate electrode 13.

In the embodiment, the removal region EL is formed at the same time with the patterning of the gate electrode 13. The removal region is disposed in order to suppress the increase of the parasitic capacitance which is produced by the gate electrode 13, the gate insulating film 12, and the semiconductor layers that are formed in the peripheral region.

Thereafter, a p⁻ type impurity is injected and diffused with using the gate insulating film 12 and the gate electrode 13 as a mask, to form the channel region 16 on the drain layer 11A. Thereafter, an n type impurity is injected into the surface layer of the channel region 16 to form an n⁺ impurity diffusion region 17A which will be formed as the source region. An NSG film 15A is then formed on the entire surface, so that the structure shown in FIG. 3 is obtained.

Next, a photoresist is applied, and then patterned by the photolithography method so that an opening is formed in a part of the region where the gate electrode 13 is formed. The NSG films 14 and 15A are etched with using the resist film (not shown) as a second mask, thereby forming an opening OP.

In this step, depending on the film thickness of polycrystalline silicon gate 13, only the NSG film 15A may be removed. When this is employed, the etching depth of the gate electrode 13 shown in FIG. 4 can be reduced.

Thereafter, the entire surface is etched back, so that the side wall insulator 18 which consists of the NSG film 15A is formed on the side walls of the NSG film 14, the gate electrode 13, and the gate insulating film 12, and a recess OB1 is formed in the channel region 16. At this time, in the n⁺ impurity diffusion region 17A, the center is removed by the recess OB1, and each of the impurity diffusion regions is formed as the source region 17, with the result that the structure shown in FIG. 4 is obtained.

Although not shown in FIG. 4, for example, further boron may be ion-implanted into the recess OB1 to form a p⁺⁺ contact region C as shown in FIG. 1.

At this time, a side wall insulator is formed also on the removal region EL and the semiconductor layers are exposed. Furthermore, also the recess OB2 is formed together with the recess OB1. This portion functions as the channel stopper for a current which flows from the layers below the gate electrode 13 to the periphery of the semiconductor chip.

Thereafter, AlSi film is deposited on the entire surface by the CVD method or sputtering, and the film is patterned, whereby the source electrode wiring 19 is formed so as to be contacted with the exposed body region 8 and a part of the source region 17, and the gate electrode wiring 20 for contact to the gate electrode is formed. As a result, the power MOSFET having the structure shown in FIG. 1 is completed. The drain electrode D is formed on the back face of the semiconductor substrate.

Although not shown in the figures, the recess OB2 in which the semiconductor layers are exposed is thereafter thoroughly covered by a passivation film (an $Si_3N_4$ film, a polyimide film, or the like). Therefore, problems such as deterioration of properties, and a short circuit are eliminated.

As described above, according to the method of fabricating a semiconductor device of the embodiment, the NSG film 14 is selectively formed on the gate electrode 13, the NSG film 15A is further formed on the entire surface, an etch back is then conducted so that the side wall insulator 18 is formed, the recess OB1 is formed in the channel region 16, and the center part of the n⁺ impurity diffusion region 17A is eliminated by the recess, thereby forming the doughnut source region 17. Therefore, a photomask step which, in the prior art, must be conducted in the patterning for forming the source region 17 is not required.

Consequently, in the entire process of the embodiment of the invention, a photomask is required only in the following three steps:

1) the step of forming the patterning mask for forming the gate electrode (FIG. 2), 2) the step of forming the opening OP for contact to the gate electrode, and 3) the step of forming the mask for forming the wiring layer.

In the embodiment, it is required to use only the three photomasks in total. Unlike the prior art in which six photomasks are used, the problems in that the number of mask steps and accompanying steps is very large, that the production process is complicated, and that the production cost is high can be suppressed.

Although one further mask is required, the removal region EL may be covered with a photoresist prior to the etch back, so that the removal region is covered with the NSG film and prevented from being exposed.

In the embodiment described above, the gate electrode is made of polycrystalline silicon. The invention is not restricted to this. Alternatively, for example, polycide or a metal may be used as a gate electrode.

Embodiment 2

Figure 9:
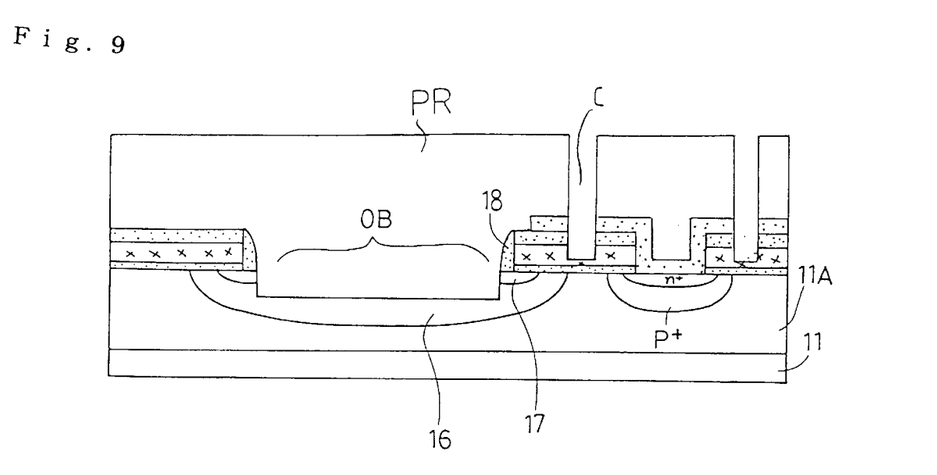
FIG. 9 is a section view of a power MOSFET illustrating a second embodiment of the invention.
Figure 10:
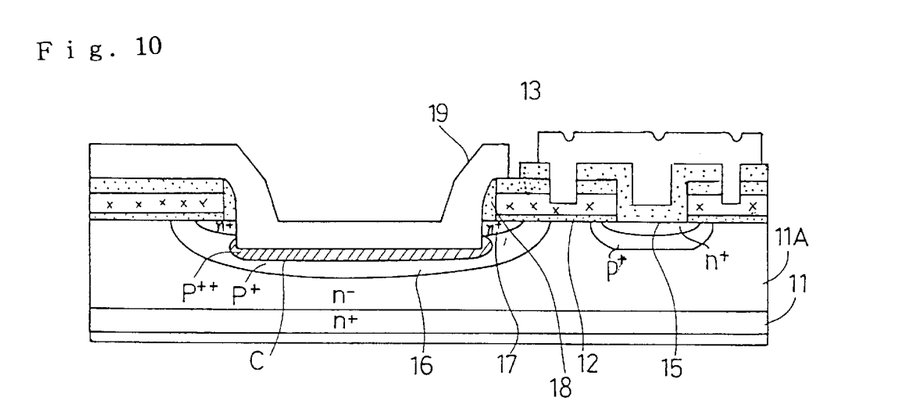
FIG. 10 is a section view of the power MOSFET illustrating the second embodiment of the invention.

In a second embodiment as shown in FIG. 9, the NSG film 15A may remain in the peripheral region. Specifically, the peripheral region is covered with a resist film, and an etch back is then conducted to form a spacer. Thereafter, the recess OB is formed with using the spacer as a mask, and contact regions C are formed with using an illustrated photomask PR. Finally, a metal wiring is formed as shown in FIG. 10.

In this process, the two layers of NSG films are formed in the peripheral region, and hence a shock which may be applied during a bonding process can be absorbed.

Embodiment 3

Figure 11A:
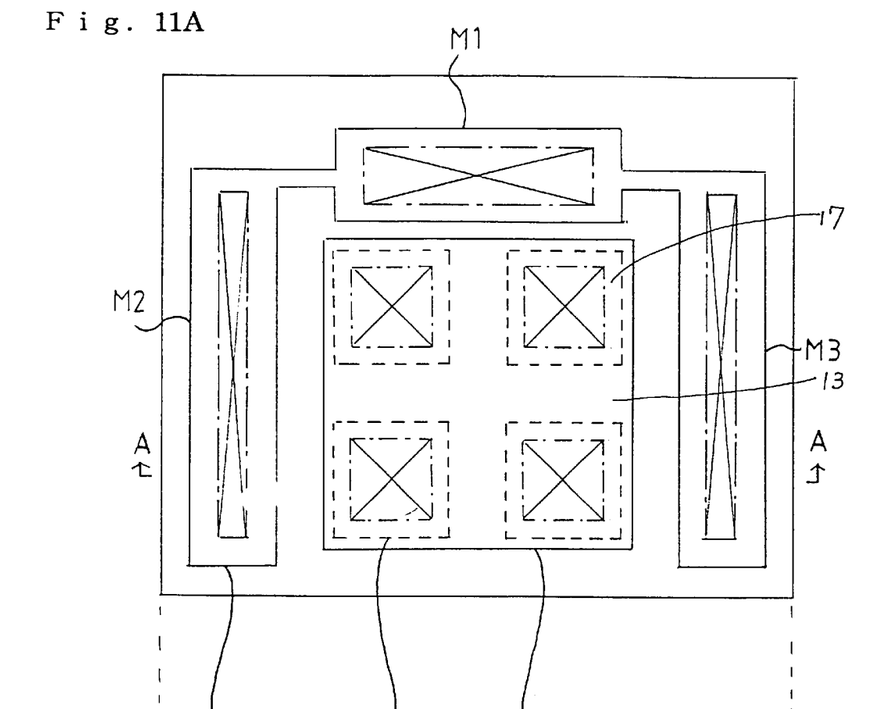
FIGS. 11A and 11B is a section view of a power MOSFET illustrating a third embodiment of the invention.

Hereinafter, the detailed story of semiconductor device the present invention as a third embodiment will be described with reference to FIGS. 11 to 18. FIG. 11A is a diagrammatic plan view of the semiconductor device. Diagrammatically, four recesses OB1 are formed in the center. A contact indicated by the symbol × is formed in each of the recesses. Therefore, the region between the one-dot chain line and the broken line serves as the source region 17.

The gate electrode 13 is formed on the entire surface except the recesses OB1, and hence has a lattice-like shape in the cell region. The gate electrode wiring 20 consists of a wiring of a metal such as Al. A metal M1 is disposed for a bonding region, and metals M2 and M3 which are respectively located in the right and left sides are disposed in order to reduce the gate resistance.

Figure 11B:
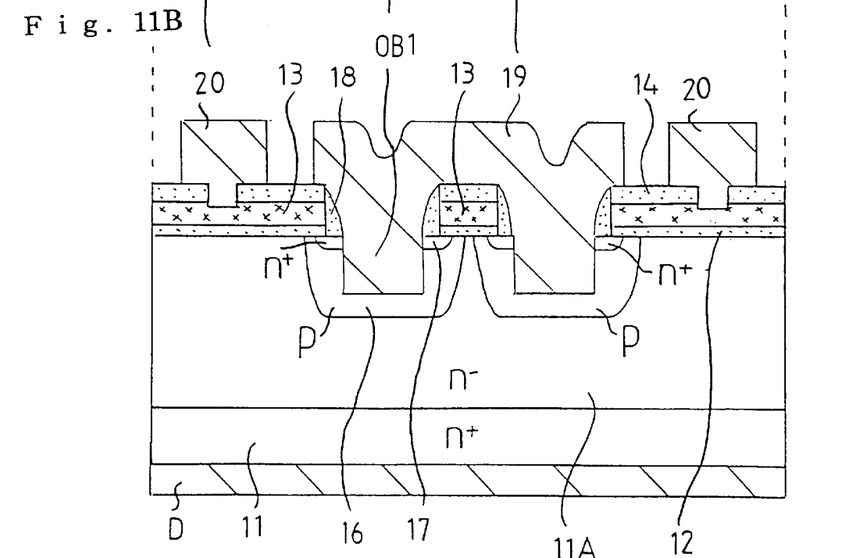

FIG. 11B is a section view taken along the line A—A of the plan view.

In the third embodiment, it is noted that the step of patterning the thick oxide film 3 shown in FIG. 5 requires one mask, and this step is omitted so as that the entire surface of the gate insulating film 2 remains to be covered, instead of covering the peripheral region with the thick oxide film 3. However, the existence of the gate electrode 13 formed in the peripheral region increases the gate-drain parasitic capacitance in which the gate insulating film 12 is used as a dielectric. This is caused simply by the reduction of the film thickness. In the case where the parasitic capacitance does not produce a serious problem, since the removal region EL as the second recess is not required to be formed, the above configuration can be realized more easily by a three-mask process which will be described below.

First, as same as shown in FIG. 2, the drain layer 11A is formed on the semiconductor substrate 11 by epitaxial growth. Next, the oxide film 12A which will be formed as the gate insulating film 12, the polycrystalline silicon film 13A, and the NSG film 14 are deposited.

Figure 12:
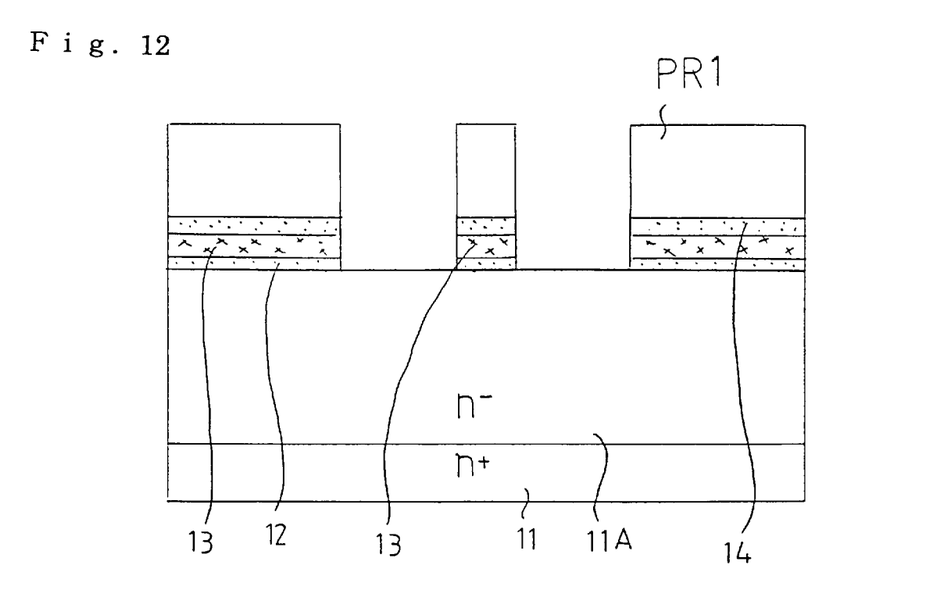
FIG. 12 is a section view of the power MOSFET illustrating the third embodiment of the invention.

Next, the NSG film 14, the polycrystalline silicon film 13A, and the oxide film 12A are etched with using the resist film PR1 which is patterned as shown in FIG. 12, as the first mask to form the gate electrode 13.

Thereafter, a p⁻ type impurity is injected and diffused with using the gate electrode 13 as a mask, to form the channel region 16 on the drain layer 11A. Thereafter, an n⁻ type impurity is injected into the surface layer of the channel region 16 to form the n⁺ impurity diffusion region 17A which will be formed as the source region.

The NSG film 15A is then formed on the entire surface. The entire surface of the NSG film 15A is etched back, so that the side wall insulator 18 which consists of the NSG film 15 is formed on the side walls of the NSG film 14, the gate electrode 13, and the gate insulating film 12. (See FIG. 13.)

Figure 13:
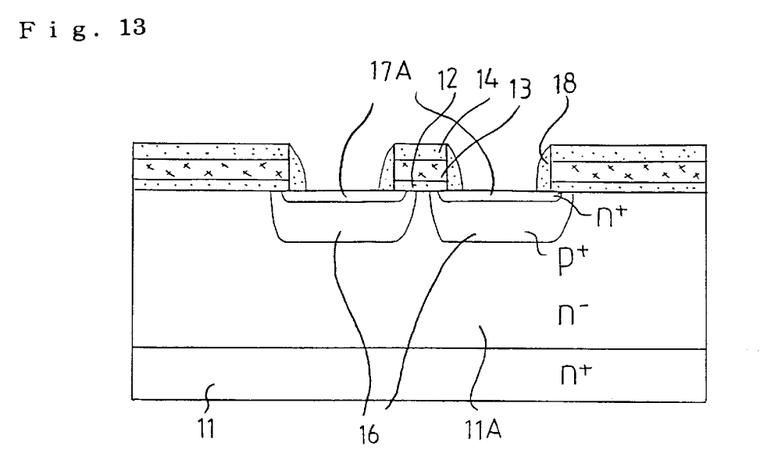
FIG. 13 is a section view of the power MOSFET illustrating the third embodiment of the invention.

Thereafter, the recess OB1 is formed in the channel region 16 with using the side wall insulator 18 as a mask, thereby forming the source region 17.

Figure 14:
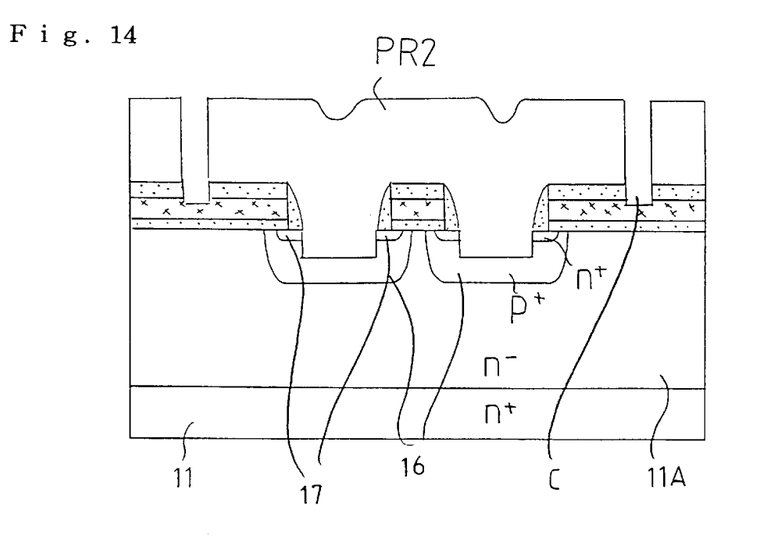
FIG. 14 is a section view of the power MOSFET illustrating the third embodiment of the invention.

As shown in FIG. 14, the contact regions C for the gate electrode are then formed with using a photomask PR2. The metals are etched with using a photomask PR3 which is not shown, so that the source electrode wiring 19 and the gate electrode wiring 20 are formed as shown in FIG. 11.

As a result of these steps, the power MOSFET can be realized with using the three mask. As the miniaturization is advancing, the film thicknesses of a polycrystalline silicon gate and metals become smaller. Particularly when a thick oxide film such as shown in FIG. 5 is employed, there arises a problem of the step coverage, or problems such as that the gate resistance is increased and that the wiring is broken are produced. In the three-mask process, however, these problems can be solved.

As described above, the parasitic capacitance in the peripheral region is increased.

Embodiment 4

Further, this increase of the parasitic capacitance in the peripheral region is improved and the semiconductor layers in the removal region EL shown in FIG. 1 is prevented from being exposed as a result of a process of FIGS. 15 to 18 explained hereafter.

The process is conducted in order to prevent the semiconductor layers in the removal region EL shown in FIG. 1 in the first embodiment from being exposed.

First, as same as shown in FIG. 2, the drain layer 11A is formed on the semiconductor substrate 11 by epitaxial growth. Next, the oxide film 12A which will be formed as the gate insulating film 12, the polycrystalline silicon film 13A, and the NSG film 14 are deposited.

Figure 15:
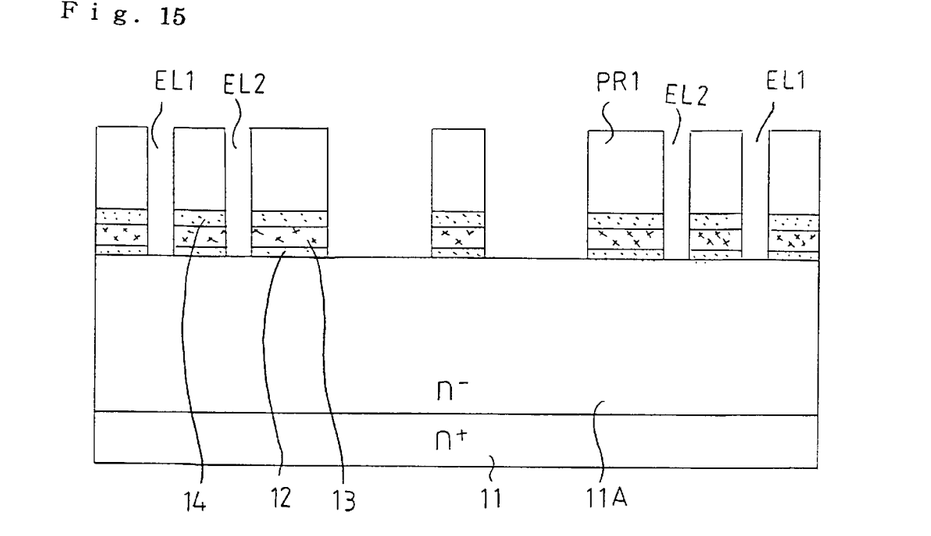
FIG. 15 is a section view of a power MOSFET illustrating a fourth embodiment of the invention.

Next, the NSG film 14, the polycrystalline silicon film 13A, and the oxide film 12A are etched with using the resist film PR1 which is patterned as shown in FIG. 15, as the first mask to form the gate electrode 13. At the same time, removal regions EL1 and EL2 are formed in the peripheral region. Preferably, plural removal regions are formed in order to reduce the capacitance. Although description will be made with reference to FIG. 16 later, the removal regions are formed so as to have a narrow width in order that the removal regions EL1 and EL2 are completely buried as a result of the coverage of the NSG film.

Thereafter, a p⁻ type impurity is injected and diffused with using the gate electrode 13 as a mask, to form the channel region 16 on the drain layer 11A. Thereafter, an n⁻ type impurity is injected into the surface layer of the channel region 16 to form the n⁺ impurity diffusion region 17A which will be formed as the source region.

The NSG film 15A is then formed on the entire surface. (See FIG. 16.)

Figure 16:
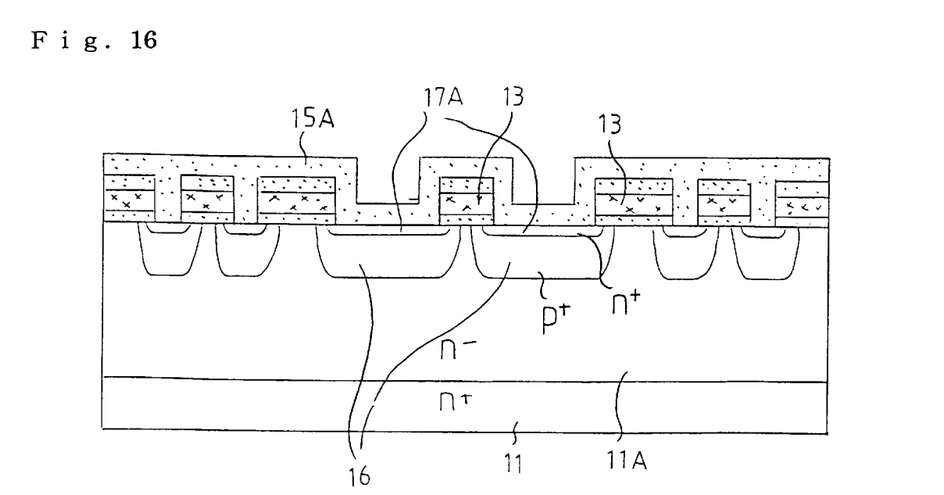
FIG. 16 is a section view of the power MOSFET illustrating the fourth embodiment of the invention.

When the NSG film 15A is formed by the CVD method, the film growth is started from both the side faces of the removal region EL1, EL2 of FIG. 16. Therefore, it is preferable to set the width of the removal region to be equal to or smaller than two times the thickness of the NSG film.

The entire surface is then etched back, so that the side wall insulator 18 is formed on the side walls of the NSG film 14, the gate electrode 13, and the gate insulating film 12. Thereafter, the recess OB1 is formed in the channel region 16 with using the side wall insulator 18 as a mask, thereby forming the source region 17.

During this process, since the removal region EL1, EL2 is completely buried, the semiconductor layers are not exposed unlike the case of the removal region EL of FIG. 1.

Figure 17:
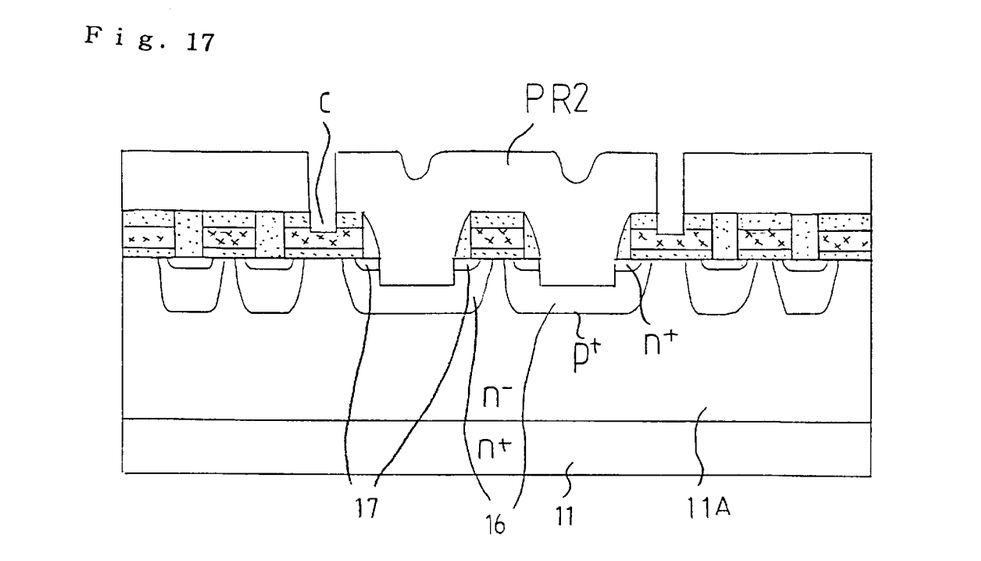
FIG. 17 is a section view of the power MOSFET illustrating the fourth embodiment of the invention.
Figure 18:
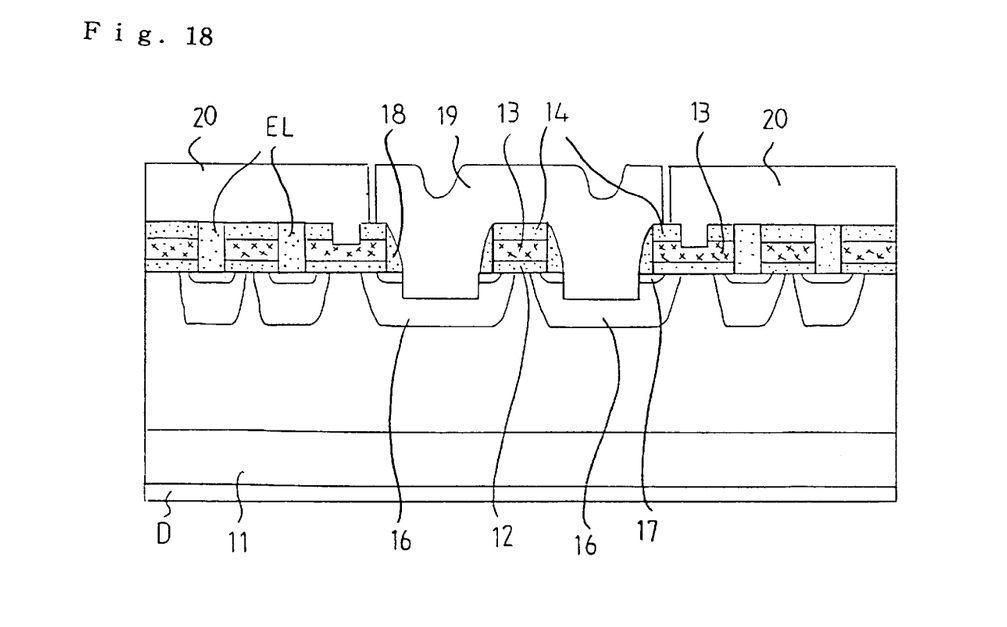
FIG. 18 is a section view of the power MOSFET illustrating the fourth embodiment of the invention.

As shown in FIG. 17, the contacts C for the gate electrode are then formed with using the photomask PR2. Thereafter, the metals are etched with using the photomask PR3 which is not shown, so that the source electrode wiring 19 and the gate electrode wiring 20 are formed as shown in FIG. 18.

As described above, a thick oxide film is omitted, and a photomask step which, in the prior art, must be conducted in the formation of the source region are omitted. Consequently, in the entire process of the embodiment of the invention, a photomask is required only in the following three steps:

1) the step of forming the patterning mask for forming the gate electrode, 2) the step of forming the opening for contact to the gate electrode, and 3) the step of forming the mask for forming the wiring layer.

As described above, in the embodiments, it is required to use only three photomasks in total. Unlike the prior art in which six photomasks are used, the number of mask steps and accompanying steps can be reduced, the labor in the production process can be saved, and the production cost can be remarkably reduced.

The removal of a part of the gate electrode located in the peripheral region, and the gate insulating film below the part of the gate electrode can suppress the increase of the parasitic capacitance.

Even when, as the advancement of the miniaturization of a cell region, the film thicknesses of a gate made of polycrystalline silicon and a gate electrode made of a metal become smaller, reduction of the step coverage and increase of the resistance due to the reduction can be suppressed because a thick oxide film is not formed.

Since an insulating material is embedded in a region where the one gate electrode and the gate insulating film below the one gate electrode are removed away, improvement of properties such as dielectric strength can be realized.

Because of the process in which the gate insulating film, the conductor layer, and the insulating film are sequentially formed over the periphery of the semiconductor chip, the number of masks can be reduced by one.

The channel region and the first impurity region layer are formed with using the gate electrode as a mask, the first recess is formed with using the side wall as a mask, and at the same time the source region is formed by removing the center of the first impurity region layer, with the result that the semiconductor device can be realized by using three masks in total.

When, in the step of forming the gate electrode, an opening is formed in a part of the peripheral region by removing the gate electrode, the parasitic capacitance in the peripheral region can be prevented from being increased, without increasing the number of steps.

When, in the step of forming the first impurity region layer, a second impurity region layer of the same conductivity type is formed in the opening, and, in the step of forming the first recess, a second recess is formed by removing a part of the second impurity region layer, the second recess can be used as a channel stopper.

Finally, the dielectric strength can be improved by burying the second recess with an insulating film.

What is claimed is:

1. A method of fabricating a semiconductor device comprising the steps of:

forming a drain layer of a first conduction type on a surface layer of a semiconductor substrate of the first conduction type;

forming a first insulating film, a conductive film, and a second insulating film successively on the entire surface of the semiconductor substrate including the drain layer;

patterning the second insulating film, the conductive film, and the first insulating film which are located in a cell region of the semiconductor substrate to form a gate insulating film and a gate electrode which consists of the conductive film so that the gate insulating film remains extending to a periphery of the semiconductor substrate;

injecting an impurity of the second conduction type into a surface layer of the drain layer with using the gate electrode as a mask, thereby forming a channel region;

injecting an impurity of the first conduction type into the channel region with using the gate electrode as a mask, thereby forming a first impurity region layer of the first conduction type;

forming a side wall insulator on a side wall of the gate electrode, the side wall insulator being formed only on side walls of the patterned second insulating film, the patterned conductive film, and the patterned first insulating film;

forming a first recess with using the side wall insulator as a mask, and at the same time removing a center of the first impurity region layer, thereby forming a source region;

removing a part of the second insulating film, thereby forming a gate contact region; and forming a source electrode in the first recess, and a gate electrode wiring in the gate contact region.

2. The method of fabricating a semiconductor device according to claim 1, wherein, after the step of forming the first impurity region layer, the step of forming the gate contact region is executed, and the step of forming the side wall insulator and the step of forming the source region are then executed successively.

3. The method of fabricating a semiconductor device according to claim 2, wherein in the step of forming the gate electrode, an opening is formed in a part of the peripheral region by removing the gate electrode.

4. The method of fabricating a semiconductor device according to claim 3, wherein in the step of forming the first impurity region layer, a second impurity region layer of the same conduction type is formed in the opening, and during the step of forming the first recess, a second recess is formed by removing a part of the second impurity region layer.

5. The method of fabricating a semiconductor device according to claim 4, wherein the step of forming a side wall insulator comprises a step of depositing an insulating film so that the second recess is buried by the insulating film.

6. The method of fabrication a semiconductor device according to claim 1 further comprising the steps of:

forming the gate electrode, and forming removal regions in the peripheral region at the same time of forming the gate electrode;

injecting an impurity of the second conduction type into a surface layer of the drain layer with using the gate electrode as a mask, thereby forming a channel region, at the same time of injecting the same impurity into the removal regions;

injecting an impurity of the first conduction type into the channel region with using the gate electrode as a mask, thereby forming a first impurity region layer of the first conduction type, at the same time of injecting the same impurity into the removal regions;

depositing a third insulating film on the entire surface so that the removal regions are completely buried by the third insulating film;

etching back the entire surface since the removal region is completely buried.

7. The method of fabricating a semiconductor device according to claim 6, wherein a width of each of the removal regions is formed to be equal to or smaller than two times the thickness of the third insulating film.

8. The method of fabricating a semiconductor device according to claim 1, wherein the gate contact region is formed by removing a part of the second insulating film located in a peripheral region outside the cell region.

9. The method of fabricating a semiconductor device according to claim 1, wherein the step of forming a side wall insulator includes the steps of:

forming a third insulating film on the entire surface; and etching back the third insulating film.

* * * * *